United States Patent
Chang et al.

(10) Patent No.: US 11,963,405 B2
(45) Date of Patent: Apr. 16, 2024

(54) DISPLAY, DISPLAY PANEL, AND ELECTRONIC TERMINAL

(71) Applicant: KunShan Go-Visionox Opto-Electronics Co., Ltd., Suzhou (CN)

(72) Inventors: Miao Chang, Suzhou (CN); Weilong Li, Suzhou (CN); Lu Zhang, Suzhou (CN); Siming Hu, Suzhou (CN); Zhenzhen Han, Suzhou (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 647 days.

(21) Appl. No.: 17/144,545

(22) Filed: Jan. 8, 2021

(65) Prior Publication Data

US 2021/0134936 A1 May 6, 2021

Related U.S. Application Data

(63) Continuation of application No. PCT/CN2020/070732, filed on Jan. 7, 2020.

(30) Foreign Application Priority Data

Jan. 28, 2019 (CN) .......................... 201910081913.3

(51) Int. Cl.
*H10K 59/131* (2023.01)
*H01L 27/02* (2006.01)
(Continued)

(52) U.S. Cl.
CPC ....... *H10K 59/131* (2023.02); *H01L 27/0288* (2013.01); *H01L 27/0292* (2013.01);
(Continued)

(58) Field of Classification Search
CPC .. H10K 59/131; H10K 59/126; H10K 77/111; H10K 2102/311; H01L 27/0288;
(Continued)

(56) References Cited

U.S. PATENT DOCUMENTS

2016/0027380 A1    1/2016  Kim et al.
2017/0337873 A1*  11/2017  Kim .................. G09G 3/3233
2019/0067404 A1*   2/2019  Lee .................. H10K 59/131

FOREIGN PATENT DOCUMENTS

CN    105304015 A    2/2016
CN    106910823 A    6/2017
(Continued)

OTHER PUBLICATIONS

Chinese First Office Action dated Jun. 3, 2020 in corresponding Chinese application No. 201910081913.3; 17 pages.
(Continued)

*Primary Examiner* — Tu-Tu V Ho
(74) *Attorney, Agent, or Firm* — Maier & Maier, PLLC

(57) ABSTRACT

A display and a display panel are provided. An additional VDD wire is arranged in an irregular-shaped region. The VDD wire is connected to a pixel arranged in the irregular-shaped region through a plurality of connection wires, such that the display may have a narrow side edge, and at the same time, a difference between impedances of the irregular-shaped region and a regular-shaped display region may not be large, and a display region may not be split.

19 Claims, 2 Drawing Sheets

(51) Int. Cl.
*H10K 59/126* (2023.01)
*H10K 77/10* (2023.01)
*G06F 3/044* (2006.01)
*G09G 3/3233* (2016.01)
*H04B 1/3827* (2015.01)
*H10K 102/00* (2023.01)

(52) U.S. Cl.
CPC ....... *H01L 27/0296* (2013.01); *H10K 59/126* (2023.02); *H10K 77/111* (2023.02); *G06F 3/044* (2013.01); *G09G 3/3233* (2013.01); *G09G 2320/0233* (2013.01); *H04B 1/3827* (2013.01); *H10K 2102/311* (2023.02)

(58) Field of Classification Search
CPC . H01L 27/0292; H01L 27/0296; G06F 3/044; G09G 3/3233; G09G 2320/0233; H04B 1/3827
USPC .......................................................... 257/40
See application file for complete search history.

(56) References Cited

FOREIGN PATENT DOCUMENTS

| | | |
|---|---|---|
| CN | 107978622 A | 5/2018 |
| CN | 107991799 A | 5/2018 |
| CN | 108010942 A | 5/2018 |
| CN | 108445684 A | 8/2018 |
| CN | 108648615 A | 10/2018 |
| CN | 108648695 A | 10/2018 |
| CN | 108877519 A | 11/2018 |
| CN | 108962030 A | 12/2018 |
| CN | 109087591 A | 12/2018 |
| CN | 109742128 A | 5/2019 |
| CN | 107146527 B | 1/2020 |

OTHER PUBLICATIONS

International Search Report dated Apr. 8, 2020 in corresponding International application No. PCT/CN2020/070732; 13 pages.
Notification to Grant Patent Right for Invention dated Dec. 4, 2020 in corresponding Chinese application No. 201910081913.3, 9 pages.

* cited by examiner

DISPLAY, DISPLAY PANEL, AND ELECTRONIC TERMINAL

CROSS-REFERENCE TO RELATED APPLICATIONS

The present application is a continuation-application of International (PCT) Patent Application No. PCT/CN2020/070732 filed on Jan. 7, 2020, which claims the foreign priority of Chinese Patent Application No. 201910081913.3, filed on Jan. 28, 2019 in the National Intellectual Property Administration of China, the entire contents of which are hereby incorporated by reference in its entirety.

FIELD

The present disclosure relates to the field of displaying, and in particular to a display, a display panel, and an electronic terminal.

BACKGROUND

As mobile phones develop from a mobile phone having a keypad to a mobile phone having a touch-screen, a screen-to-body ratio of the mobile phone is getting higher and higher. A mobile phone having a full screen has become dominant in the market. The full screen allows a visual area of the mobile phone to increase, and the mobile phone may look more elegant and have a high-tech appearance. Further, a larger-sized screen may be arranged on a front of the mobile phone without changing an area of the front of the mobile phone, and a visual effect of the mobile phone may be increased significantly. In order to meet various requirements of users, at least one corner of a full-screen display panel may be configured to be in an irregular shape. For example, a left-bottom corner and a right-bottom corner of the display panel are configured to be arced. When the irregular-shaped panel is manufactured by a conventional process, wires may be arranged in a non-display region at an outer periphery of the irregular-shaped region. The wires may include a circuit and a wire for driving pixels. To be specific, a data line for providing a data signal and a VDD wire for providing a display signal may be arranged in the non-display region. However, arrangement of these signal lines may be complicated, and therefore, reducing a space occupied by these signal lines may be significantly difficult, and a mobile phone having a narrow edge may not be easily achieved.

SUMMARY

According to a first aspect of the present disclosure, a display panel is provided and includes an irregular-shaped region; a plurality of pixels; and a non-display region. The plurality of pixels are arranged in an array in the irregular-shaped region. The non-display region is arranged around a periphery of the irregular-shaped region. The plurality of data lines, one VDD wire, and a plurality of connection wires are arranged in the non-display region, each of the plurality of data lines is electrically connected to at least one of the plurality of pixels correspondingly, and the VDD wire is electrically connected to the plurality of pixels correspondingly through the plurality of connection wires.

According to a second aspect of the present disclosure, a display is provided and includes a driving circuit and the display panel mentioned in the first aspect. The driving circuit is electrically coupled to a data line and the VDD wire of the display panel.

According to a third aspect of the present disclosure, an electronic terminal is provided and includes a driving circuit and the display panel mentioned in the first aspect. The driving circuit is electrically coupled to a data line and the VDD wire of the display panel. The display panel further includes a first electrostatic protection assembly and a second electrostatic protection assembly, the first electrostatic protection assembly is connected to the VDD wire, an orthographic projection of the second electrostatic protection assembly onto the display panel is at least partially overlapped with an orthographic projection of the first electrostatic protection assembly, and an insulation layer is arranged between the first and the second electrostatic protection assemblies.

According to the present disclosure, a display and a display panel are provided. An additional VDD wire may be arranged in an irregular-shaped region. The additional VDD wire may be electrically connected to a pixel in the irregular-shaped region. In this way, a difference between a current received by a pixel in a regular-shaped display region and a current received by the pixel in the irregular-shaped region may be reduced, such that splitting the display region caused by a relatively large difference between a voltage of an impedance of the pixel in the irregular-shaped region and a voltage of an impedance of the pixel in the regular-shaped display region may be avoided. Further, only one VDD wire is arranged in the irregular-shaped region, a space of the non-display region occupied by the VDD wire may be reduced, enabling a narrow edge of the electronic device to be achieved.

DETAILED DESCRIPTION

Figure 1:
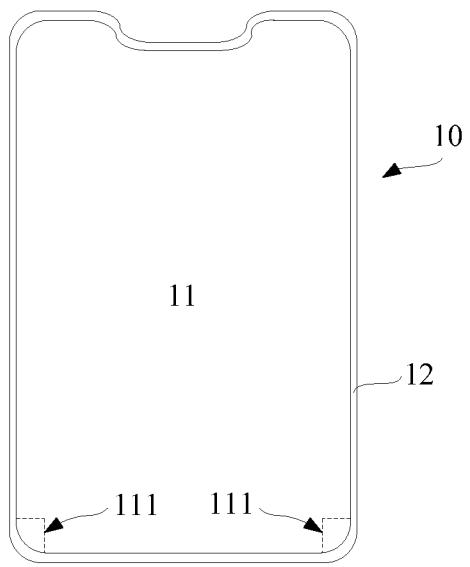
FIG. 1 is a top view of a display panel according to an embodiment of the present disclosure.

According to the present disclosure, one VDD wire may be arranged in an irregular-shaped region. The VDD wire may be connected to a pixel in the irregular-shaped region through a plurality of connection wires. In this way, a difference between a current received by a pixel in a regular-shaped region and a current received by the pixel in the irregular-shaped region may be reduced, such that a difference between a voltage of an impedance of the irregular-shaped region and a voltage of an impedance of the regular-shaped display region may be reduced, and brightness of the irregular-shaped region may not be significantly different from brightness of the regular-shaped display region. Further, only one VDD wire is arranged in the irregular-shaped region, a small portion of the irregular-shaped region may be occupied by the VDD wire, such that a narrow edge of a display panel may be achieved.

Technical solutions of embodiments of the present disclosure may be clearly and comprehensively illustrated by referring to the drawings of the embodiments. It may be understood that, specific embodiments of the present disclosure may be described to explain the present disclosure, but does not limit the scope of the present disclosure. Without a conflict, technical features of various embodiments may be combined. To be noted that, in order to provide a precise description, the drawings show a part of components related to the present disclosure, but do not show all components. Based on embodiments of the present disclosure, any other embodiments obtained by an ordinary skilled person in the art without any creative work should be within the scope of the present disclosure.

As shown in FIG. 1, a display panel 10 may include a display region 11 and a non-display region 12 arranged around a periphery of the display region 11.

Figure 2:
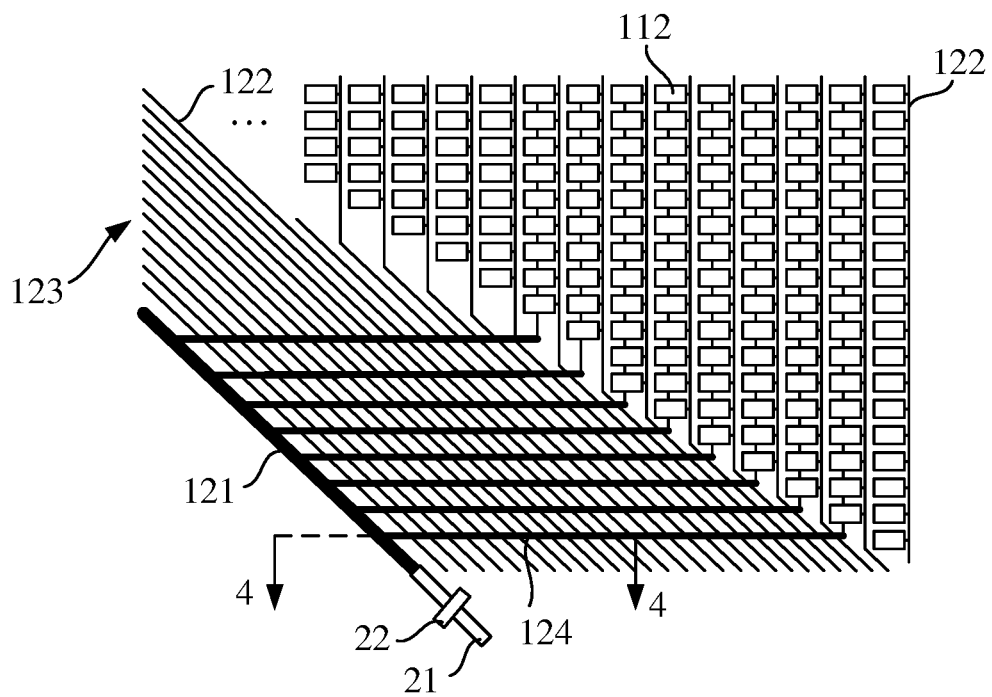
FIG. 2 is a schematic view of an arrangement of wires in an irregular-shaped region shown in FIG. 1 according to an embodiment of the present disclosure.

A plurality of pixels 112 may be arranged in the display region 11, as shown in FIG. 2. The plurality of pixels 112 may include an R (red) sub-pixel, a G (green) sub-pixel, and a B (blue) sub-pixel. Each pixel 112 may be controlled by a driving circuit to display various grayscales, such that the display panel 10 may display a colorful image.

At least one corner of the display region 11 may be an arced corner. In other words, the display region 11 may include at least two straight edges adjacent to each other, and an arced angle may be formed between the two adjacent straight edges to serve as the arced corner of the display region. For example, as shown in FIG. 1, a left-bottom corner and a right-bottom corner of the display region 11 may be arced corners. Therefore, the display region 11 may include an irregular-shaped display region 111 formed by non-straight edges and a regular-shaped display region (a reference numeral of which is not shown in the figure) formed by the straight edges. The irregular-shaped region may refer to the irregular-shaped display region 111 and an arc-shaped region located in the non-display region 12 and corresponding to the irregular-shaped display region 111.

At least two adjacent rows of pixels 112 may be arranged in the irregular-shaped display region 111 of the display panel 10, and may have different numbers of pixels 112. For example, as shown in FIG. 2, along a direction from a bottom to a top, the number of pixels 112 in a second row may be one more than the number of pixels 112 in a first row, such that a stage may be formed by the two adjacent rows of pixels 112. Sizes of any two stages along a row direction may be the same or different, a size difference between the two stages along the row direction may be equal to an integer number of times of a pixel 112 along the row direction, and the size difference may be determined based on configuration of the display panel 10. As shown in FIG. 2, along a direction from the bottom to the top, a first stage may be formed by the pixel 112 of the first row and the pixels 112 of the second row, and a second stage may be formed by the pixels 112 of the second row and the pixels 112 of a third row. A size of the first stage along the row direction may be equal to one pixel, and a size the second stage along the row direction may be equal to one pixel. Therefore, there is no size difference between the first and the second stages along the row direction. However, in the regular-shaped display region, any two adjacent rows of pixels 112 may be aligned on the row direction. That is, in the regular-shaped display region, each row has a same number of pixels.

A driving circuit for driving the pixel 112 to illuminate and a signal wire corresponding to the pixel 112 may be arranged in the non-display region 12. To be specific, the non-display region 12 may include a wiring region.

The wiring region may be adjacent to and fit with the outer periphery of the display region 11 (including a portion of the irregular-shaped region). Signal wires in various types may be arranged in the wiring region. The signal wire may refer to wires in various types for achieving signal transmission. For example, the signal wire may include a scan-drive output line. An end of the scan-drive output line may be connected to a gate driving unit, and the other end of the scan-drive output line may be connected to a pixel circuit. In this way, the scan-drive output line may transmit a scan-drive signal to the pixel 112 connected to the scan-drive output line. As another example, the signal wire may include a VDD wire 121 and a plurality of data lines 122. The plurality of data lines 122 may be arranged in the non-display region 12, and a sub-region within the non-display region 12 occupied by the plurality of signal lines 122 may be referred as a data wiring region 123. As shown in FIG. 2, each data line 122 may be connected to a column of pixels 112 correspondingly.

In the irregular-shaped region, one VDD wire 121 may be arranged. The VDD wire 121 may be arranged at an outer periphery of the data wiring region 123. Further, a plurality of connection wires 124 may be arranged in the non-display region 12. The plurality of connection wires 124 may be connected to the VDD wire 121 and corresponding pixels 112. Each of the plurality of connection wires 124 may cross over the data wiring region 123. For example, orthographic projections of the plurality of connection wires 124 onto the display panel 10 may be located within the data wiring region 123.

Figure 3:
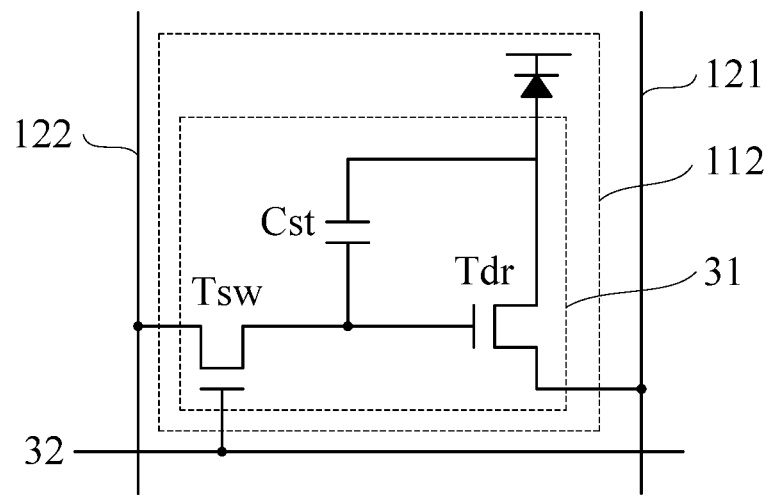
FIG. 3 is a circuit diagram of a pixel in the irregular-shaped region shown in FIG. 2 according to an embodiment of the present disclosure.

Further, FIG. 3 shows a principle and a process of the display panel 10 displaying an image through the above-mentioned VDD wire 121 and the plurality of connection wires 124.

FIG. 3 is a pixel circuit diagram of the irregular-shaped region shown in FIG. 2 according to an embodiment of the present disclosure. As shown in FIG. 3, an organic light-emitting diode (OLED) display panel 10 may be taken as an example. A pixel circuit 31 may be connected to a scanning line 32, the data line 122, and the VDD wire 121 adjacent to the pixel circuit 31. A current flowing in an OLED component may be controlled in response to a scanning pulse from the scanning line 32 and based on a data signal Vdata from the data line 122. The pixel circuit 31 may include a switch transistor Tsw, a driving transistor Tdr, and a capacitor Cst.

The switch transistor Tsw may be switched based on the scanning pulse transmitted from the scanning line 32, and the switch transistor Tsw may transmit the signal data Vdata from the data line 122 to the driving transistor Tdr. The driving transistor Tdr may be switched based on the data signal Vdata transmitted from the switch transistor Tsw, and the driving transistor Tdr may control a current, which is sent from the VDD wire 121 and may drive the OLED component to illuminate. The capacitor Cst may be connected between a gate electrode and a drain electrode of the driving transistor Tdr. The capacitor Cst may be configured to store a voltage corresponding to the data signal Vdata transmitted to the gate electrode of the driving transistor Tdr, and configured to enable the driving transistor Tdr to be connected through the stored voltage.

The OLED component may at least include: an anode electrode (or a pixel electrode) connected to source electrode of the driving transistor Tdr; an organic light-emitting layer formed on the anode electrode; and a cathode electrode layer formed on the organic light-emitting layer. The OLED component may emit light based on a display signal transmitted from the driving transistor Tdr to display a predefined image.

According to the present disclosure, one VDD wire 121 may be arranged in the irregular-shaped region, a difference between voltages of impedances of the regular-shaped display region and the irregular-shaped region may be reduced, such that a brightness difference between the regular-shaped display region and the irregular-shaped region may not be caused. To be specific, in the present disclosure, the VDD wire 121 may be arranged in the irregular-shaped region and receive the current, a path along which the current flows to reach the pixel in the regular-shaped display region may not be significantly different from a path along which the current flows to reach the pixel in the irregular-shaped region. Therefore, a significant current attenuation may not be caused, i.e., the difference between the current received by the pixel 112 in the irregular-shaped region and the current received by the pixels 112 in the regular-shaped display region may be reduced. The voltage of the impedance of the pixel in the irregular-shaped region may not be significantly different from the voltage of the impedance of the pixel in the regular-shaped display region. Therefore, a brightness difference between the irregular-shaped region and the regular-shaped display region may be reduced, and splitting the display region caused by the relatively large difference between voltages of two impedances of the pixels may be avoided.

In the present disclosure, only one VDD wire 121 may be arranged in the irregular-shaped region. The number of VDD wires may be small, such that an area within the non-display region 12 occupied by the VDD wire may be reduced, and the display panel 10 having the narrow edge may be achieved. Further, the plurality of connection wires 124 may be arranged to cross over the data wiring region 123, and the data wiring region 123 is a region that cannot be omitted from the non-display region 12. Therefore, an additional region to be occupied by the plurality of connection wires 124 may not be required, and the narrow edge of the display panel 10 may not be affected.

In the present disclosure, the VDD wire 121 may be arranged to follow a shape of an edge of the irregular-shaped display region 111, and a shape of the data wiring region 123 may be the same as the shape of the irregular-shaped display region 111. In this way, the wiring region may be close to and fit with the irregular-shaped display region 111 as much as possible, such that the area of the non-display region 12 may be reduced, enabling the display panel 10 having the narrow edge to be achieved easily. For example, in the present disclosure, the VDD wire 121 may be arranged to extend along a shape of an outer edge of the data wiring region 123 as much as possible, such that the display panel 10 may have a most narrow edge. Further, configuration of the signal wires, which include the VDD wire 121 and the plurality of connection wires, may be determined based on the space.

As shown in FIG. 2, one of the plurality of connection wires 124 may be connected to a column of pixels 112. In the irregular-shaped region, the VDD wire 121 may transmit the display signal to each of the plurality of connection wires 124 in a predefined chronological manner, and the display signal may further be transmitted to corresponding connected pixels 112.

In order to reduce the number of connection wires 124 and complexity of the arrangement of the connection wires 124, one connection wire 124 may be connected to a plurality of columns of pixels 112. For example, one connection wire 124 may be connected to two columns of pixels 112. In the irregular-shaped region, the VDD wire 121 may transmit the display signal to each of the plurality of connection wires 124 in the predefined chronological manner, and the display signal may further be transmitted to corresponding connected pixels 112. To be specific, chronological transmission of the display signal may be controlled by a de-multiplexing circuitry. When the de-multiplexing circuitry is connected and control the display signal to be transmitted to a column of pixels 112 connected to one particular 124, the de-multiplexing circuitry may be switched off, and the display signal may not be transmitted to any other columns of pixels 112 connected to the particular wire 124. A working principle of the de-multiplexing circuitry is well-known to any ordinary skilled person in the art, and will not be described in details hereinafter. Of course, one connection wire 124 may be connected to more than two columns of pixels 112.

The connection wire 124 may be a single layer of metal, such as Mo, Cu, and the like, or metal alloy. Alternatively, the connection wire 124 may have a plurality of layers of electric conductive material. In order to control an impedance of a circuitry, material having a relatively low impedance may be used to form the connection wire 124 in the present disclosure.

In one embodiment, the connection wire 124 and the driving transistor Tdr of the pixel 112 may be arranged on a same layer, and may be made of same material. In this way, in the present disclosure, the connection wire 124 and the driving transistor Tdr may be formed by a same process at the same time, such that the number of processes of manufacturing the display panel 10 may not be increased.

Figure 4:
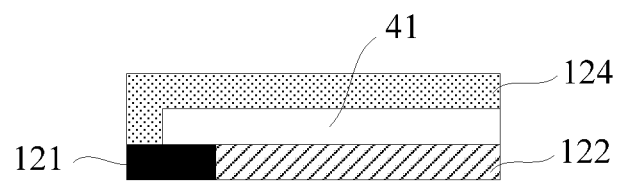
FIG. 4 is a partial cross-sectional view of the irregular-shaped region shown in FIG. 2, taken along the line 4-4.

As shown in FIG. 2 and FIG. 4, the display panel 10 may include an array substrate which includes a stack of a plurality of layers. The VDD wire 121 and the plurality of data lines 122 may be arranged on a same layer of the array substrate. The plurality of connection wires 124 and the VDD wire 121 may be arranged on different layers of the array substrate. The plurality of connection wires 124 may be arranged on a layer above (as shown in FIG. 4) or on a layer below the layer of the plurality of data lines 122. However, a first insulation layer 41 may be arranged between the plurality of connection wires 124 and the plurality of data lines 122. To be specific, the VDD wire 121 and the data line 122 may be formed by one same mask process. Subsequently, the first insulation layer 41 may be formed in a projection region of the data wiring region 123. The first insulation layer 41 may define a through hole, and the VDD wire 121 may be exposed through the through hole. Another mask process may be performed to form the connection wires 124. Electric conductive material may be deposited in the through hole to form the connection wires 124, such that the connection wires 124 may be connected to the VDD wire 121. The plurality of connection wires 124 and the VDD wire 121 may be made of same material, such that an impedance of wires along a horizontal direction may be easily controlled.

Further, as shown in FIG. 1 and FIG. 2, the non-display region 12 at the outer periphery of the regular-shaped display region may be referred as a straight-edged region. A plurality of VDD wires may be arranged in the straight-edged region. The VDD wire 121 arranged in a portion of the irregular-shaped region located in the non-display region 12 and the VDD wires in the straight-edged region may be formed by the same mask process.

As shown in FIG. 2, the display panel 10 may further include a first electrostatic protection assembly 21 and a second electrostatic protection assembly 22. The first electrostatic protection assembly 21 may be connected to the VDD wire 121. An orthographic projection of the second electrostatic protection assembly 22 onto the display panel 10 may be at least partially overlapped with an orthographic projection of the first electrostatic protection assembly 21 onto the display panel 10.

The first electrostatic protection assembly 21 and the second electrostatic protection assembly 22 may not be arranged on a same layer. A second insulation layer may be arranged between the first electrostatic protection assembly 21 and the second electrostatic protection assembly 22. In this way, the first electrostatic protection assembly 21 and the second electrostatic protection assembly 22 may be coupled to each other through the second insulation layer therebetween to form a capacitor. The capacitor may be protruded from the VDD wire 121, and a spiking effect may be generated, such that static electricity generated on at least one of the VDD wire 121 and the connection wires 124 may be conducted through the first electrostatic protection assembly 21 and the second electrostatic protection assembly 22 to be released. Therefore, the first electrostatic protection assembly 21 and the second electrostatic protection assembly 22 may be configured to conduct the static electricity generated on at least one of the VDD wire 121 and the connection wires 124 to a region in which the first electrostatic protection assembly 21 and the second electrostatic protection assembly 22 are arranged, and the static electricity may be released therein.

The first electrostatic protection assembly 21 and the second electrostatic protection assembly 22 may be configured to provide electrostatic protection for the display panel 10. The first electrostatic protection assembly 21 and the second electrostatic protection assembly 22 may conduct the static electricity generated on the display panel 10 to the region in which the first electrostatic protection assembly 21 and the second electrostatic protection assembly 22 are arranged, enabling the static electricity to be released therein, such that the static electricity may not harm the display panel 10.

To be specific, the first electrostatic protection assembly 1 may be extended from an end of the VDD wire 121. That is, an extending direction of the electrostatic protection assembly 21 may be parallel to an extending direction of the VDD wire 121, and an extending direction of the second electrostatic protection assembly 22 may be perpendicular to the extending direction of the VDD wire 121.

The first electrostatic protection assembly 21 may be electrically connected to the VDD wire 121, and the first electrostatic protection assembly 21 and the VDD wire 121 may be arranged on the same layer. In the present disclosure, the first electrostatic protection assembly 21 may be a part of the VDD wire 121. In this way, the first electrostatic protection assembly 21 and the VDD wire 121 may be formed by a same process, such that an additional process may not be required. The second electrostatic protection assembly 22 and the plurality of connection wires 124 may preferably be arranged on a same layer, and the second electrostatic protection assembly 22 may be spaced apart from the plurality of connection wires 124. In this way, in the present embodiment, the second electrostatic protection assembly 22 and the plurality of connection wires 124 may be formed by a same process.

It may be understood that, the display panel 10 in the above embodiments may further include other components. For example, the display panel 10 may further include a packaging region. The wiring region may be arranged between the gate driving region and the packaging region. The packaging region may be adjacent to and fit with the wiring region. In this way, the display panel 10 may be protected. To be specific, the packaging region may typically be arranged at an outermost side of the non-display region to isolate the non-display region from water and oxygen, such that the water and the oxygen may not impact the driving circuit and wiring structures inside the display panel 10, and the display panel 10 may work normally.

Further, a type of the display panel 10 may not be limited by the present disclosure. For example, the display panel 10 may be an OLED display panel, a liquid crystal display panel based on low temperature poly-silicon (LTPS), a liquid crystal display panel having polymer-stabilized vertical alignment, a liquid crystal display panel having multi-domain vertical alignment, or a flexible touch-screen display panel. Further, compared to a resistive touch-screen display panel, a capacitive touch-screen display panel may have a longer service life and a high light transmittance, and multi-touch may be performed. The display panel 10 may be a capacitive touch-screen display panel.

The present disclosure may provide a display including a driving circuit and a display panel. The driving circuit may be electrically coupled to a data line of the display panel and the VDD wire. Configuration of the display panel may refer to the display panel described in the above embodiments. Therefore, the display panel in the present embodiment may achieve a same technical effect.

The display includes and is not limited to a mobile terminal, such as a smart mobile phone, a personal digital assistant, and the like, and a wearable device which may be wearable to a user or embedded into clothes, jewelries, and accessories.

The above description may be embodiments of the present disclosure only, and does not limit the scope of the present disclosure. Any equivalent structural or process transformation obtained based on the specification and drawings of the present disclosure, such as combinations of technical features of various embodiments, directly or indirectly applied in other related art, should also be within the scope of the present disclosure.

What is claimed is:

1. A display panel, comprising:
an irregular-shaped region;
a plurality of pixels, arranged in an array in the irregular-shaped region; and
a non-display region, arranged around a periphery of the irregular-shaped region, wherein a plurality of data lines, one VDD wire, and a plurality of connection wires are arranged in the non-display region, each of the plurality of data lines is electrically connected to at least one of the plurality of pixels correspondingly, and the VDD wire is electrically connected to the plurality of pixels correspondingly through the plurality of connection wires,
wherein the irregular-shaped region comprises a data wiring region, the plurality of data lines are arranged in the data wiring region, the VDD wire is arranged at an outer periphery of the data wiring region, and the plurality of connection wires are configured to cross over the data wiring region and insulated from the plurality of data lines.

2. The display panel according to claim 1, wherein orthographic projections of the plurality of connection wires onto the display panel are located within the data wiring region.

3. The display panel according to claim 1, wherein the VDD wire is configured to extend along an edge of the irregular-shaped region, and a shape of an edge of the data wiring region is the same as the shape of the edge of the irregular-shaped region.

4. The display panel according to claim 1, wherein the display panel comprises an array substrate, the array substrate comprises a stack of a plurality of layers, and the plurality of connection wires and the VDD wire are arranged in different layers of the array substrate.

5. The display panel according to claim 1, wherein the display panel further comprises a straight-edged region, another VDD wire is arranged in the straight-edged region, and the VDD wire arranged in the irregular-shaped region is electrically connected to the VDD wire arranged in the straight-edged region.

6. The display panel according to claim 1, wherein the display panel is a flexible display panel.

7. A display, comprising a driving circuit and the display panel according to claim 1,
wherein the driving circuit is electrically coupled to a data line and the VDD wire of the display panel.

8. The display according to claim 7, wherein the display panel comprises an array substrate, the array substrate comprises a stack of a plurality of layers, and the plurality of connection wires and the VDD wire are arranged in different layers of the array substrate.

9. The display according to claim 7, wherein the display panel further comprises a first electrostatic protection assembly and a second electrostatic protection assembly, the first electrostatic protection assembly is connected to the VDD wire, an orthographic projection of the second electrostatic protection assembly onto the display panel is at least partially overlapped with an orthographic projection of the first electrostatic protection assembly, a second insulation layer is arranged between the first and the second electrostatic protection assemblies, such that the first and the second electrostatic protection assemblies are coupled to each other to form a capacitor.

10. An electronic terminal, comprising a driving circuit and the display panel according to claim 1, wherein
the driving circuit is electrically coupled to a data line and the VDD wire of the display panel; and
the display panel further comprises a first electrostatic protection assembly and a second electrostatic protection assembly, the first electrostatic protection assembly is connected to the VDD wire, an orthographic projection of the second electrostatic protection assembly onto the display panel is at least partially overlapped with an orthographic projection of the first electrostatic protection assembly, an insulation layer is arranged between the first and the second electrostatic protection assemblies.

11. A display panel, comprising:
an irregular-shaped region;
a plurality of pixels, arranged in an array in the irregular-shaped region; and
a non-display region, arranged around a periphery of the irregular-shaped region, wherein a plurality of data lines, one VDD wire, and a plurality of connection wires are arranged in the non-display region, each of the plurality of data lines is electrically connected to at least one of the plurality of pixels correspondingly, and the VDD wire is electrically connected to the plurality of pixels correspondingly through the plurality of connection wires,
wherein the display panel comprises an array substrate, the array substrate comprises a stack of a plurality of layers, and the plurality of connection wires and the VDD wire are arranged in different layers of the array substrate, and
wherein the VDD wire and the plurality of data lines are arranged in a same layer of the array substrate, and a first insulation layer is arranged between a layer of the plurality of connection wires and a layer of the plurality of data lines.

12. The display panel according to claim 11, wherein the first insulation layer defines a through hole, the VDD wire is exposed through the through hole, a portion of the plurality of connection wires is received in the through hole to electrically connect to the VDD wire.

13. The display panel according to claim 11, wherein the plurality of connection wires are arranged in a same layer.

14. The display panel according to claim 11, wherein the plurality of connection wires and a source electrode of a driving transistor of the plurality of pixels are arranged in a same layer of the array substrate and are made of same material.

15. A display, comprising a driving circuit and the display panel according to claim 11, wherein the plurality of data lines are arranged in a data wiring region, the VDD wire is arranged at an outer periphery of the data wiring region, and the plurality of connection wires are arranged to cross over the data wiring region and are insulated from the plurality of data lines.

16. A display panel, comprising:
an irregular-shaped region;
a plurality of pixels, arranged in an array in the irregular-shaped region; and
a non-display region, arranged around a periphery of the irregular-shaped region, wherein a plurality of data lines, one VDD wire, and a plurality of connection wires are arranged in the non-display region, each of the plurality of data lines is electrically connected to at least one of the plurality of pixels correspondingly, and the VDD wire is electrically connected to the plurality of pixels correspondingly through the plurality of connection wires,
wherein the display panel further comprises a first electrostatic protection assembly and a second electrostatic protection assembly, the first electrostatic protection assembly is connected to the VDD wire, an orthographic projection of the second electrostatic protection assembly onto the display panel is at least partially overlapped with an orthographic projection of the first electrostatic protection assembly onto the display panel, and a second insulation layer is arranged between the first and the second electrostatic protection assemblies, such that the first and the second electrostatic protection assemblies are coupled to each other to form a capacitor.

17. The display panel according to claim 16, wherein the first electrostatic protection assembly and the VDD wire are arranged in a same layer.

18. The display panel according to claim 16, wherein the second electrostatic protection assembly and the plurality of connection wires are arranged in a same layer, and the second electrostatic protection assembly is spaced apart from the plurality of connection wires.

19. The display panel according to claim 16, wherein an extending direction of the first electrostatic protection assembly is parallel to an extending direction of the VDD wire, and an extending direction of second electrostatic protection assembly is perpendicular to the extending direction of the VDD wire.

\* \* \* \* \*